United States Patent
Kurita

(10) Patent No.: US 6,862,241 B2
(45) Date of Patent: Mar. 1, 2005

(54) SEMICONDUCTOR DEVICE AND METHOD FOR CONTROLLING SEMICONDUCTOR DEVICE

(75) Inventor: Yuji Kurita, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 28 days.

(21) Appl. No.: 10/617,752

(22) Filed: Jul. 14, 2003

(65) Prior Publication Data

US 2004/0027893 A1 Feb. 12, 2004

(30) Foreign Application Priority Data

Aug. 8, 2002 (JP) ........................................ 2002-231647

(51) Int. Cl.$^7$ ............................................. G11C 17/16
(52) U.S. Cl. .................................. 365/225.7; 327/525
(58) Field of Search ............................. 365/225.7, 96; 327/525

(56) References Cited

U.S. PATENT DOCUMENTS 5,929,691 A * 7/1999 Kim et al. ................... 327/525
6,667,916 B2 * 12/2003 Kyung ........................ 365/201

* cited by examiner

*Primary Examiner*—Tan T. Nguyen
(74) *Attorney, Agent, or Firm*—Arent Fox PLLC

(57) ABSTRACT

A semiconductor device operated in modes that may be re-set. The semiconductor device includes mode setting fuse circuits, each having a plurality of fuses. Each mode setting fuse circuit stores a code for setting the mode in accordance with the breakage pattern of the fuses. A fuse information selection circuit is provided with the codes from the mode setting fuse circuits. The fuse information selection circuit provides a code selection circuit with the code having the highest priority. The code selection circuit provides a decoding circuit with the high priority code. When a determination circuit receives an invalidating signal from an invalidation fuse circuit, the code selection circuit provides the decoding circuit with a code of a program circuit.

39 Claims, 7 Drawing Sheets

| A1 | A2 | A3 | Refreshing Section |
|---|---|---|---|
| H | L | L | 32Mb Upper Addresses |
| L | H | L | 16Mb Upper Addresses |
| H | L | H | 32Mb Lower Addresses |
| L | H | H | 16Mb Lower Addresses |

| Fuse | | | Refreshing Section |
|---|---|---|---|
| Fc1 | Fc2 | Fc3 | |
| Broken | Not Broken | Not Broken | 32Mb Upper Addresses |
| Not Broken | Broken | Not Broken | 16Mb Upper Addresses |
| Broken | Not Broken | Broken | 32Mb Lower Addresses |
| Not Broken | Broken | Broken | 16Mb Lower Addresses |

SEMICONDUCTOR DEVICE AND METHOD FOR CONTROLLING SEMICONDUCTOR DEVICE

CROSS-REFERENCE TO RELATED APPLICATIONS

This application is based upon and claims the benefit of priority from prior Japanese Patent Application No. 2002-231647, filed on Aug. 8, 2002, the entire contents of which are incorporated herein by reference.

BACKGROUND OF THE INVENTION

The present invention relates to a semiconductor device operated in a predetermined mode, which is selected from a plurality of modes, and a method for controlling such a semiconductor device.

Recent semiconductor devices are provided with a plurality of operation modes and are operated in a selected one of the modes. For example, in a semiconductor device, a user sets the desired operation mode by breaking a non-reciprocal device, such as a fuse. The semiconductor is manufactured in a state storing information indicating the set operation mode.

There are semiconductor devices (DRAMs) in the prior art that are provided with a partial refresh mode, which partially refreshes memory cells, or multiple low power consumption modes. In such a DRAM, a mode setting signal, which is input via an external terminal, sets the partial refresh section or the power down method.

FIG. 1 shows a first example of a prior art DRAM that executes a program to set the operation mode. A program mode signal/PE is provided to a program circuit 53 through an external terminal 51. An address code Add is provided to the program circuit 53 via an external terminal 52. The program circuit 53 retrieves an address code Add when the program mode signal/PE goes high. A decoder 54 determines the section that is to be refreshed in accordance with the retrieved address code Add. The main circuit 55 includes a memory core 55a for storing data. The main circuit 55 refreshes a predetermined section of the memory core 55a. The predetermined section is selected in accordance with a section selection signal.

The first example of the prior art DRAM requires the exclusive external terminals 51 and 52, which are not used during normal operation, and an exclusive circuit for executing programs. As a result, the system employing the DRAM and the control of the system are complicated. Due to the use of the exclusive circuit, the exclusive program cannot be controlled with a normal controller. The execution of the mode setting program is performed prior to normal operations even when the refreshing section does not have to be changed. In such a case, the program execution consumes unnecessary processing time.

To solve this problem, a DRAM may be provided with a fuse circuit. In this case, the mode is set by the information that is stored when the fuse circuit is broken. FIG. 2 illustrates a second example of a prior art semiconductor device (DRAM) that sets the operation mode in accordance with a setting code of the fuse circuit 57. The fuse circuit 57 includes a plurality of fuses 57a. The fuse circuit 57 provides a decoder 54 with a setting code that is in accordance with the breakage pattern of the fuses 57a. The decoder 54 determines the section that is to be refreshed in accordance with the setting code and provides the main circuit 55 with the section selection signal. A predetermined section of the selected memory core 55a is refreshed in accordance with the section selection signal.

However, in the DRAM of FIG. 2, once an operation mode is set, the operation mode cannot be changed. Thus, such DRAM cannot be used by one who wishes to change the operation mode after it is set.

SUMMARY OF THE INVENTION

In one aspect of the present invention, a semiconductor device is operated in accordance with a mode selected from a plurality of modes. The semiconductor device includes a plurality of mode setting fuse circuits, each generating a setting code that designates the mode and a determination signal that indicates whether the setting code is designated. A fuse information selection circuit is connected to the mode setting fuse circuits for selecting one of the setting codes in accordance with at least one of the determination signals. An invalidating fuse circuit generates an invalidating signal to invalidate the selected setting code.

In a further aspect of the present invention, a semiconductor device is operated in accordance with a mode selected from a plurality of modes. The semiconductor device includes a plurality of mode setting fuse circuits, each generating a setting code that designates the mode and a determination signal that indicates whether the setting code is designated. A priority setting circuit is connected to the mode setting fuse circuits for generating a priority signal that determines the priority order of the setting codes of the mode setting fuse circuits in accordance with the determination signals of the mode setting fuse circuits. A fuse information selection circuit is connected to the mode setting fuse circuits for selecting one of the setting codes in accordance with the priority signal. An invalidating fuse circuit is connected to the priority setting circuit for generating an invalidating signal to invalidate the selected setting code and an altering signal that changes the priority order.

In a further aspect of the present invention, a method for controlling a semiconductor device operated in a mode that is in accordance with a setting code includes setting a first setting code with a first mode setting fuse circuit, setting a second setting code with a second mode setting fuse circuit, and selecting one of the first and second setting codes.

In a further aspect of the present invention, a method for controlling a semiconductor device operated in a mode that is in accordance with a setting code includes setting a first setting code with at least one of a plurality of mode setting fuse circuits, setting a second setting code in accordance with an external mode setting signal, and validating one of the first and second setting codes.

In a further aspect of the present invention, a method for controlling a semiconductor device operated in a mode that is in accordance with a setting code includes setting a first setting code with a first mode setting fuse circuit, setting a second setting code with a second mode setting fuse circuit, selecting one of the first and second setting codes in accordance with a predetermined priority order, and validating one of the selected setting code and an external setting code that is in accordance with an external mode setting signal.

In a further aspect of the present invention, a method for controlling a semiconductor device including a plurality of mode setting fuse circuits and an invalidating fuse is provided. The semiconductor device enters one of a first state in which fuses of the mode setting fuse circuits are not broken, a second state in which the fuse of at least one of the mode setting fuse circuits is broken, and a third state in which the fuse of at least one of the mode setting fuse circuits is broken and the invalidating fuse is broken. The method includes designating a mode of the semiconductor device in accordance with an external mode setting signal when the semiconductor device is in the first state. The method also includes designating a mode that is in accordance with a setting code set by at least one of the mode setting fuse circuits when the semiconductor device is in the second state, and designating the mode in accordance with the external mode setting signal when the semiconductor device is in the third state.

In a further aspect of the present invention, a method for controlling a semiconductor device including a first mode setting fuse circuit, a second mode setting fuse circuit, an invalidating fuse, and an altering fuse is provided. The semiconductor device enters one of a first state in which fuses of the first and second mode setting fuse circuits are not broken, a second state in which the fuse of the first mode setting fuse circuit is broken and a fuse of the second mode setting fuse circuit is not broken, a third state in which the fuse of the second mode setting fuse circuit is broken and the fuse of the first mode setting fuse circuit is not broken, a fourth state in which the fuse of at least one of the first and second mode setting fuse circuits is broken and the invalidating fuse is broken, and a fifth state in which the altering fuse is broken. The method includes designating a mode of the semiconductor device in accordance with an external mode setting signal when the semiconductor device is in the first state, designating a mode that is in accordance with a setting code set by the first mode setting fuse circuit when the semiconductor device is in the second state, designating a mode that is in accordance with a setting code set by the second mode setting fuse circuit when the semiconductor device is in the third state, and designating the mode that is in accordance with the setting code set by the first mode setting fuse circuit when the semiconductor device is in the fifth state.

In a further aspect of the present invention, a method for controlling a semiconductor device operated in a mode that is in accordance with a setting code selected from a plurality of setting codes including setting codes stored in a plurality of mode setting fuse circuits, which includes a first mode setting fuse circuit and a second mode setting fuse circuit, and a setting code corresponding to an external mode setting signal is provided. The method comprising selecting the setting code corresponding to the external mode setting signal, which is validated by maintaining the mode setting fuse circuits in a state in which fuses of the mode setting fuse circuits are not broken; the setting of a mode that is in accordance with the setting code of the first mode setting fuse circuit, which is validated by breaking the fuse of the first mode setting fuse circuit; the setting of a mode that is in accordance with the setting code of the second mode setting fuse circuit, which is validated by breaking the fuse of the second mode setting fuse circuit; or the setting of a mode that is in accordance with the external mode setting signal, which is validated by breaking the invalidating fuse. The method further includes performing validation in accordance with the selection.

In a further aspect of the present invention, a method for controlling a semiconductor device operated in a mode that is in accordance with a setting code selected from a plurality of setting codes including setting codes stored in a plurality of mode setting fuse circuits, which includes a first mode setting fuse circuit, a second mode setting fuse circuit, and a third mode setting fuse circuit, and a setting code corresponding to an external mode setting signal is provided. The method includes selecting the setting code corresponding to the external mode setting signal, which is validated by maintaining the mode setting fuse circuits in a state in which fuses of the mode setting fuse circuits are not broken; the setting of a mode that is in accordance with the setting code of the first mode setting fuse circuit, which is validated by breaking the fuse of the first mode setting fuse circuit; the setting of a mode that is in accordance with the setting code of the second mode setting fuse circuit, which is validated by breaking the fuse of the second mode setting fuse circuit; the setting of a mode that is in accordance with the setting code of the third mode setting fuse circuit, which is validated by breaking the fuse of the third mode setting fuse circuit; the setting code of an invalidated mode setting fuse circuit in lieu of the setting code of a validated mode setting fuse circuit, which is validated by breaking an altering fuse; or the setting of a mode that is in accordance with the external mode setting signal, which is validated by breaking the invalidating fuse and invalidating the setting of the modes that are in accordance with the first, second, and third mode setting fuse circuits. The method further includes performing validation in accordance with the selection.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A semiconductor device 10 according to a first embodiment of the present invention will now be discussed.

Figure 1:
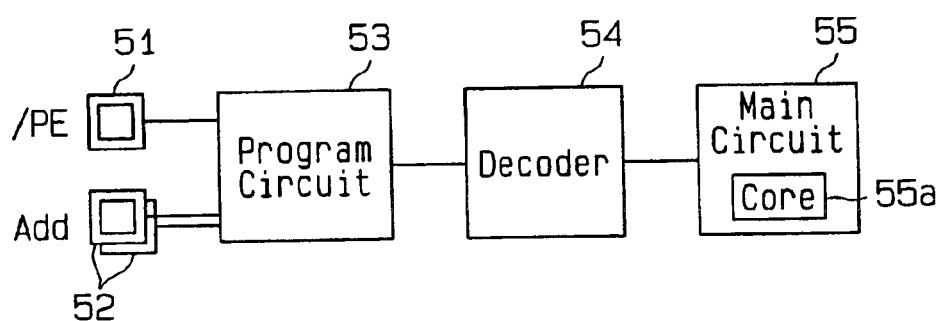
FIG. 1 is a block diagram showing a first example of a prior art DRAM.
Figure 2:
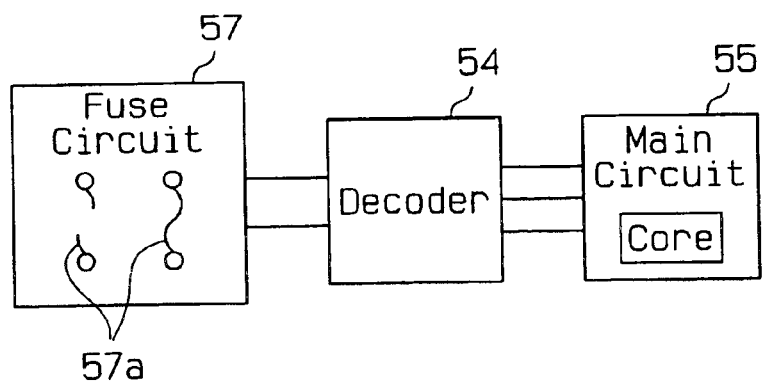
FIG. 2 is a block diagram showing a second example of a prior art DRAM.
Figure 3:
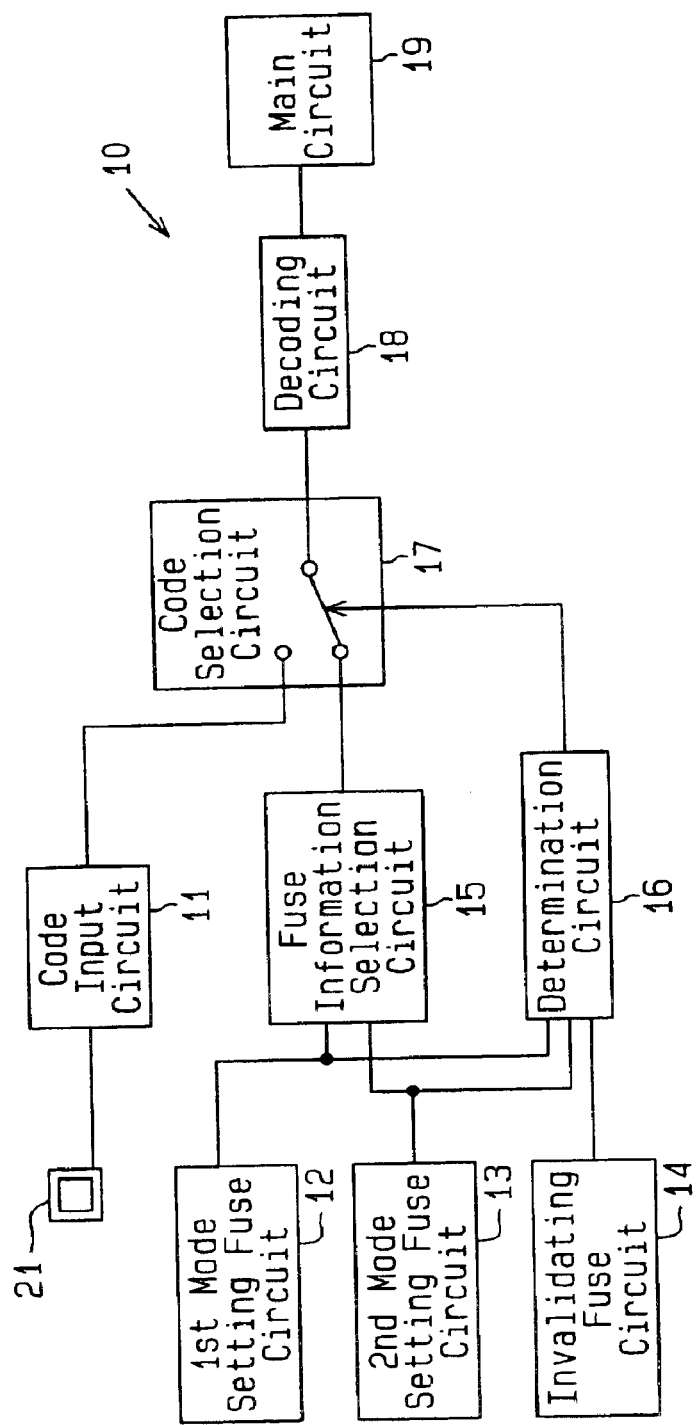
FIG. 3 is a block diagram showing a semiconductor device according to a first embodiment of the present invention.

Referring to FIG. 3, the semiconductor device 10 includes a code input circuit 11, first and second mode setting fuse circuits 12 and 13, an invalidating fuse circuit 14, a fuse information selection circuit 15, a determination circuit 16, a code selection circuit 17, a decoding circuit 18, and a main circuit 19.

An external terminal 21 is connected to the code input circuit 11. The code input circuit 11 reads codes provided to an external terminal 21 when a controller (not shown) executes a program. Further, the code input circuit 11 provides the read codes to the code selection circuit 17.

The first and second mode setting fuse circuits 12 and 13 store a code (fuse information) for setting the operation mode of the semiconductor device 10 and provides the code to the fuse information selection circuit 15.

The fuse information selection circuit 15 selects the first mode setting fuse circuit 12 or the second mode setting fuse circuit 13 and provides the code selection circuit 17 with the fuse information stored in the selected mode setting fuse circuit. For example, when the fuse of the first mode setting fuse circuit 12 is broken, the fuse information of the first mode setting fuse circuit 12 is provided to the code selection circuit 17 via the fuse information selection circuit 15. When the fuse of the second mode setting fuse circuit 13 is broken, the fuse information selection circuit 15 gives priority to and selects the fuse information of the second mode setting fuse circuit 13 and provides the fuse information to the code selection circuit 17.

The determination circuit 16 determines whether or not to use the fuse information stored in the first and second mode setting fuse circuits 12 and 13. For example, when the fuses of the first and second mode setting fuse circuits 12 and 13 are both not broken, the determination circuit 16 provides the code selection circuit 17 with a selection signal instructing use of the code provided from the external terminal 21. When one of the fuses of the first and second mode setting fuse circuits 12 and 13 is broken, the determination circuit 16 provides the code selection circuit 17 with a selection signal instructing use of the code of the mode setting fuse circuits 12 and 13. When the fuse of the invalidating fuse circuit 14 breaks, the determination circuit 16 provides the code selection circuit 17 with a selection signal instructing use of the code provided to the external terminal 21.

The code selection circuit 17, which functions as a switching circuit, provides the decoding circuit 18 with the code of the external terminal 21, the code of the first mode setting fuse circuit 12, or the code of the second mode setting fuse circuit 13 in accordance with the selection signal of the determination circuit 16.

The decoding circuit 18 generates a status signal in accordance with the code from the code selection circuit 17 and provides the status signal to the main circuit 19. The main circuit 19 operates in an operation mode that corresponds with the status signal.

Figure 4:
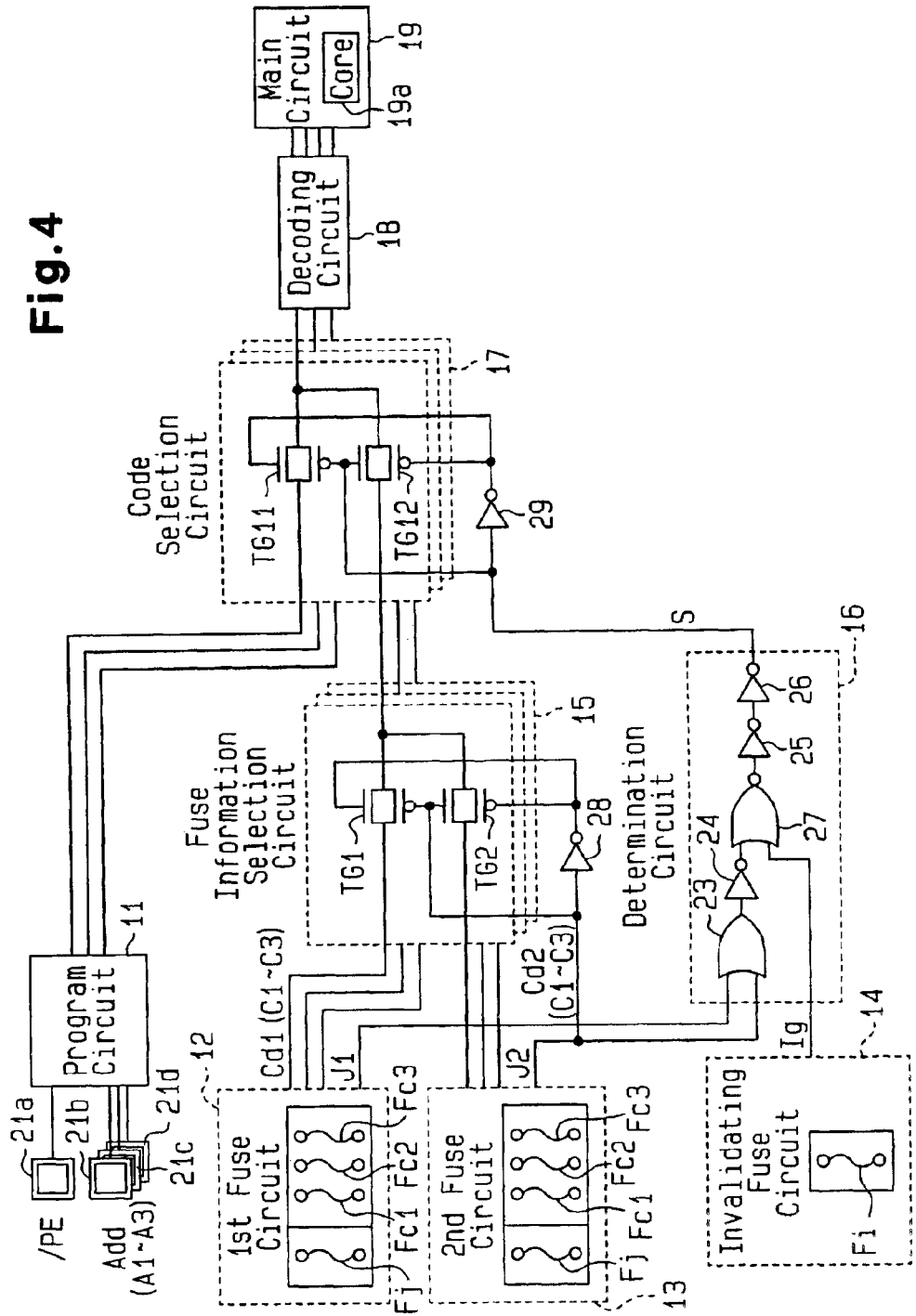
FIG. 4 is a circuit diagram showing the semiconductor device of FIG. 3 in more detail.

FIG. 4 is a detailed circuit diagram of the semiconductor device 10 of FIG. 3. The semiconductor device 10 is a DRAM provided with a partial refreshing function to refresh some of the memory cells. The memory capacity of the DRAM is, for example, 64 Mb. Among the 64 Mb of the storage section in the semiconductor device 10, 32 Mb or 16 Mb are set as a refreshing section.

As shown in FIG. 4, the code input circuit 11 functions as, for example, a program circuit. The program circuit 11 is connected to a program exclusive terminal 21a, which is provided with a negative logic program mode signal/PE, and address terminals 21b, 21c, and 21d, which are provided with address codes Add (address signals A1 to A3).

Figures 5, 6, 7:
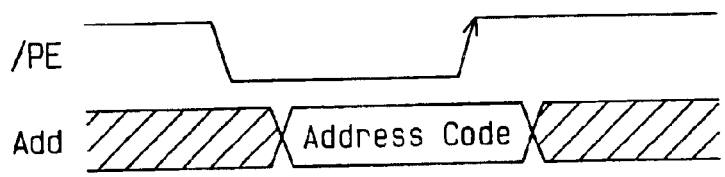
FIG. 5 is a chart illustrating the waveforms of a program mode signal and an address code.
FIG. 6 is a table showing address code levels in association with refresh sections.
FIG. 7 is a table showing fuse breakage patterns in association with refresh sections.

The program mode signal/PE is provided to a program exclusive terminal 21a when a program is executed during an exclusive processing cycle of an external controller (e.g., processing cycle for setting a mode register). The program circuit 11 retrieves the address code Add in response to the program mode signal/PE. For example, as shown in FIG. 5, the program circuit 11 initiates the input of the address signal Add when the program mode signal/PE goes low and latches the address code Add when the program mode signal/PE goes high. The program circuit 11 outputs the address code Add. Referring to FIG. 6, the refreshing section, or mode, is set in accordance with the address code Add (address signals A1 to A3).

When the address signal A1 is high, the address signal A2 is low, and the address signal A3 is low, the upper rank addresses of the 32 Mb are defined as the refreshing section. When the address signal A1 is low, the address signal A2 is high, and the address signal A3 is low, the upper rank addresses of the 16 Mb are defined as the refreshing section. When the address signal A1 is high, the address signal A2 is low, and the address signal A3 is high, the lower rank addresses of the 32 Mb are defined as the refreshing section. When the address signal A1 is low, the address signal A2 is high, and the address signal A3 is high, the lower rank addresses of the 16 Mb are defined as the refreshing section. The high and low levels indicate the logic levels of the signals A1 to A3.

Referring to FIG. 4, the mode setting fuse circuits 12 and 13 each include a determination fuse Fj and code storage fuses Fc1 to Fc3. The code storage fuses Fc1 to Fc3 of the mode setting fuse circuits 12 and 13 are broken to store setting codes (fuse information) Cd1 and Cd2, which set the refreshing section, or mode, in the associated mode setting fuse circuits 12 and 13. When at least one of the code storage fuses Fc1 to Fc3 is broken, that is, when a setting code is stored, the determination fuse Fj breaks. The storage of the setting code in the fuse circuits 12 and 13 is determined in accordance with the stage of the associated fuse Fj.

The first mode setting fuse circuit 12 provides the determination circuit 16 with a determination signal J1, which is in accordance with the breakage state of the associated determination fuse Fj, and provides the fuse information selection circuit 15 with a code Cd1, which is in accordance with the breakage state of the code storage fuses Fc1 to Fc3. The second mode setting fuse circuit 13 provides the determination circuit 16 with a determination signal J2, which is in accordance with the breakage state of the associated determination fuse Fj, and provides the fuse information selection circuit 15 with a code Cd2, which is in accordance with the breakage state of the code storage fuses Fc1 to Fc3. The codes Cd1 and Cd2 each include a first signal C1, which is output in accordance with the breakage state of the code storage fuse Fc1, a second signal C2, which is output in accordance with the breakage state of the code storage fuse Fc2, and a third signal C3, which is output in accordance with the breakage state of the code storage fuse Fc3. The signals J1, J2, C1, C2, and C3 are low when the associated fuses Fj, Fc1, Fc2, and Fc3 are not broken and are high when the associated fuses Fj, Fc1, Fc2, and Fc3 are broken. The codes Cd1 and Cd2 are used to set the refreshing section.

FIG. 7 shows the refreshing section, or operation mode, which is set in accordance with the breakage pattern of the code storage fuses Fc1 to Fc3. For example, when the code storage fuse Fc1 is broken, the code storage fuse Fc2 is not broken, and the code storage fuse Fc3 is not broken, the upper rank addresses of the 32 Mb are defined as the refreshing section. When the code storage fuse Fc1 is not broken, the code storage fuse Fc2 is broken, and the code storage fuse Fc3 is not broken, the upper rank addresses of the 16 Mb are defined as the refreshing section. When the code storage fuse Fc1 is broken, the code storage fuse Fc2 is not broken, and the code storage fuse Fc3 is broken, the lower rank addresses of the 32 Mb are defined as the refreshing section. When the code storage fuse Fc1 is not broken, the code storage fuse Fc2 is broken, and the code storage fuse Fc3 is broken, the lower rank addresses of the 16 Mb are defined as the refreshing section.

Referring to FIG. 4, the invalidating fuse circuit 14 includes an invalidating fuse Fi and provides the determination circuit 16 with an invalidating signal Ig having a level that is in accordance with the breakage state of the invalidating fuse Fi. For example, the invalidating signal Ig is low when the invalidating fuse Fi is not broken and high when the invalidating fuse Fi is broken. The fuses Fi, Fj, Fc1, Fc2, and Fc3 are non-reciprocal devices, such as a laser blow fuse, an electric melting fuse, or an insulation film breakage fuse.

The determination circuit 16 includes an OR circuit 23, inverter circuits 24, 25, and 26, and a NOR circuit 27. The determination circuit 16 generates a selection signal S in accordance with the determination signals J1 and J2 and the invalidating signal Ig, and provides the selection signal S to the code selection circuit 17.

The OR circuit 23 has a first input terminal, which receives the determination signal J1 of the first mode setting fuse circuit 12, and a second input terminal, which receives the determination signal J2 of the second mode setting fuse circuit 13. The output signal of the OR circuit 23 is input to a first input terminal of the NOR circuit 27 via the inverter circuit 24. The NOR circuit 27 also has a second input terminal, which receives the invalidating signal Ig. The output signal of the NOR circuit 27 is output as the selection signal S from the determination circuit 16 via the series-connected inverter circuits 26 and 26.

The fuse information selection circuit 15 includes transfer gates TG1 and TG2, which are configured by PMOS and NMOS transistors. The input terminal of the transfer gate TG1 is connected to the first mode setting fuse circuit 12. The input terminal of the transfer gate TG2 is connected to the second mode setting fuse circuit 13. The output terminal of the transfer gates TG1 and TG2 are connected to the code selection circuit 17. The gate of the PMOS transistor in the transfer gate TG1 and the gate of the NMOS transistor in the transfer gate TG2 are connected to each other. The two gates receive the determination signal J2 from the second mode setting fuse circuit 13. The gate of the NMOS transistor in the transfer gate TG1 and the gate of the PMOS transistor in the transfer gate TG2 are connected to each other. The two gates receive the determination signal J2, which is inverted by an inverter circuit 28.

The activation and inactivation of the transfer gates TG1 and TG2 are controlled in a complementary manner in accordance with the determination signal J2 of the second mode setting fuse circuit 13. For example, when the determination signal J2 is low, the transfer gate TG1 is switched on. This transfers the fuse information Cd1 of the first mode setting fuse circuit 12 to the code selection circuit 17 via the transfer gate TG1. When the determination signal J2 is high, the transfer gate TG2 is switched on. This transfers the fuse information Cd2 of the second mode setting fuse circuit 13 to the code selection circuit 17 via the transfer gate TG2. If the fuses Fj of the first and second mode setting fuse circuits 12 and 13 are both broken, that is, if the first and second fuse circuits 12 and 13 both store fuse information, the fuse information selection circuit 15 transfers the fuse information Cd2 of the second mode setting fuse circuit 13 to the code selection circuit 17. Accordingly, the fuse information Cd2 is given priority over the fuse information Cd1.

The code selection circuit 17 includes transfer gates TG11 and TG12, which are configured by PMOS and NMOS transistors. The input terminal of the transfer gate TG11 is connected to the program circuit 11. The input terminal of the transfer gate TG12 is connected to the fuse information selection circuit 15. The output terminals of the transfer gates TG11 and TG12 are connected to the decoding circuit 18. The gate of the PMOS transistor in the transfer gate TG11 and the gate of the NMOS transistor in the transfer gate TG12 are connected to each other. The two gates receive the selection signal S from the determination circuit 16. The gate of the NMOS transistor in the transfer gate TG11 and the gate of the PMOS transistor in the transfer gate TG12 are connected to each other. The two gates receive the selection signal S, which is inverted by an inverter circuit 29.

The activation and inactivation of the transfer gates TG11 and TG12 of the code selection circuit 17 are controlled in a complementary manner in accordance with the selection signal S. When the selection signal S is low, the transfer gate TG11 is switched on. This transfers the address code Add of the program circuit 11 to the decoding circuit 18 via the transfer gate TG11. When the selection signal S is high, the transfer gate TG12 is switched on. This transfers the code Cd1 or Cd2 of the fuse information selection circuit 15 to the decoding circuit 18 via the transfer gate TG12.

The decoding circuit 18 determines the mode for performing partial refreshing in accordance with the code provided from the code selection circuit 17 (address code Add or codes Cd1 and Cd2). Then, the decoding circuit 18 generates and provides the main circuit 19 with a status signal of the determined mode. The status signal, which is a refreshing section setting signal, includes a signal that sets the capacity of partial refreshing to 32 Mb or 16 Mb and a signal that sets the partial refreshing address section to the upper rank addresses or the lower rank addresses.

The main circuit 19 has a memory core 19a, which includes memory cells, a row decoder, a column decoder, and a sense amplifier. The main circuit 19 refreshes the memory cells in a predetermined section of the memory core 19a.

The operation of the semiconductor device 10 will now be discussed.

First, an example in which mode setting codes are not stored in neither the first mode setting fuse circuit 12 nor the second mode setting fuse circuit 13 will now be described. In this case, the determination fuses Fj and Fi are both not broken. The determination signals J1 and J2 of the first and second mode setting fuse circuits 12 and 13 are both low, and the invalidating signal Ig is low. In the code selection circuit 17, the low selection signal S switches on the transfer gate TG1 and switches off the transfer gate TG12. This connects the decoding circuit 18 to the program circuit 11 via the transfer gate TG11 of the code selection circuit 17.

In this state, a controller (not shown) executes a program to provide the program circuit 11 with the program mode signal/PE and the address code Add. The address code Add is output from the program circuit 11 and input to the decoding circuit 18 via the code selection circuit 17. In the decoding circuit 18, the mode status signal is generated from the input address code Add. The memory cells in the predetermined section corresponding to the status signal are refreshed in the main circuit 19.

An example in which fuse information is stored only in the first mode setting fuse circuit 12 will now be discussed. In this case, the determination fuse Fj of the first mode setting fuse circuit 12 is broken and the determination fuse Fj and the invalidating fuse Fi of the second mode setting fuse circuit 13 are not broken. Accordingly, the determination signal J1 goes high, and the determination signal J2 and the invalidating signal Ig go low. The low determination signal J2 switches on the transfer gate TG1 and switches off the transfer gate TG2 in the fuse information selection circuit 15. This connects the code selection circuit 17 to the first mode setting fuse circuit 12 via the transfer gate TG1 of the fuse information selection circuit 15.

By providing the determination circuit with the high determination signal J1, a low determination signal J2, and a low invalidation signal Ig, the determination circuit 16 provides the code selection circuit 17 with the selection signal S at a high level. This switches off the transfer gate TG11 and switches on the transfer gate TG12 in the code selection circuit 17. The decoding circuit 18 is connected to the fuse information selection circuit 15 via the transfer gate TG12 of the code selection circuit 17.

In this case, the code Cd1 of the first mode setting fuse circuit 12 is provided to the decoding circuit 18 via the fuse information selection circuit 15 and the code selection circuit 17. The decoding circuit 18 generates a mode status signal from the input code Cd1. The memory cells in the predetermined section corresponding to the status signal are refreshed in the main circuit 19.

An example in which fuse information is stored in both of the first and second mode setting fuse circuits 12 and 13 will now be described. In this case, the determination fuses Fj of the first and second mode setting fuse circuit 12 and 13 are both broken and the determination fuses Fi are not broken. The determination signals J1 and J2 are high, and the invalidating signal Ig is low. In the fuse information selection circuit 15, the high determination signal J2 switches off the transfer gate TG1 and switches on the transfer gate TG2. This connects the code selection circuit 17 to the second mode setting fuse circuit 13 via the transfer gate TG2 of the fuse information selection circuit 15.

In this case, the determination circuit 16 provides the code selection circuit 17 with the determination signals J1 and J2 at a high level, the invalidation signal Ig at a low level, and the selection signal S at a high level. In the code selection circuit 17, the transfer gate TG11 is switched off and the transfer gate TG12 is switched on. This connects the decoding circuit 18 to the fuse information selection circuit 15 via the transfer gate TG12 of the code selection circuit 17.

In this state, the code Cd2 of the second mode setting fuse circuit 13 is provided to the decoding circuit 18 via the fuse information selection circuit 15 and the code selection circuit 17. The decoding circuit 18 generates a mode status signal from the input code Cd2. The memory cells in the predetermined section corresponding to the status signal are refreshed in the main circuit 19. This operation is performed in the same manner when the fuse information is stored only in the second mode setting fuse circuit 13.

The invalidation of the fuse information of the first and second mode setting fuse circuits 12 and 13 will now be discussed. In this case, the determination fuses Fj and the invalidating fuses Fi of the first and second mode setting fuse circuits 12 and 13 are broken. The determination signals J1 and J2 are high, and the invalidating signal Ig is high. The determination circuit 16 outputs the selection signal S at a low level in accordance with the signals J1, J2, and Ig. In the code selection circuit 17, the transfer gate TG11 is switched on and the transfer gate TG12 is switched off. This connects the decoding circuit 18 to the program circuit 11 via the transfer gate TG11 of the code selection circuit 17.

The program execution provides the program circuit 11 with the program mode signal /PE and the address code Add. The program circuit 11 provides the address code Add to the decoding circuit 18 via the code selection circuit 17. The decoding circuit 18 generates a mode status signal in accordance with the input address code Add. The memory cells in the predetermined section corresponding to the status signal are refreshed in the main circuit 19.

This operation is performed in the same manner when the fuse information is stored only in one of the first and second mode setting fuse circuits 12 and 13 and the invalidating fuse Fi breaks.

Figure 8:
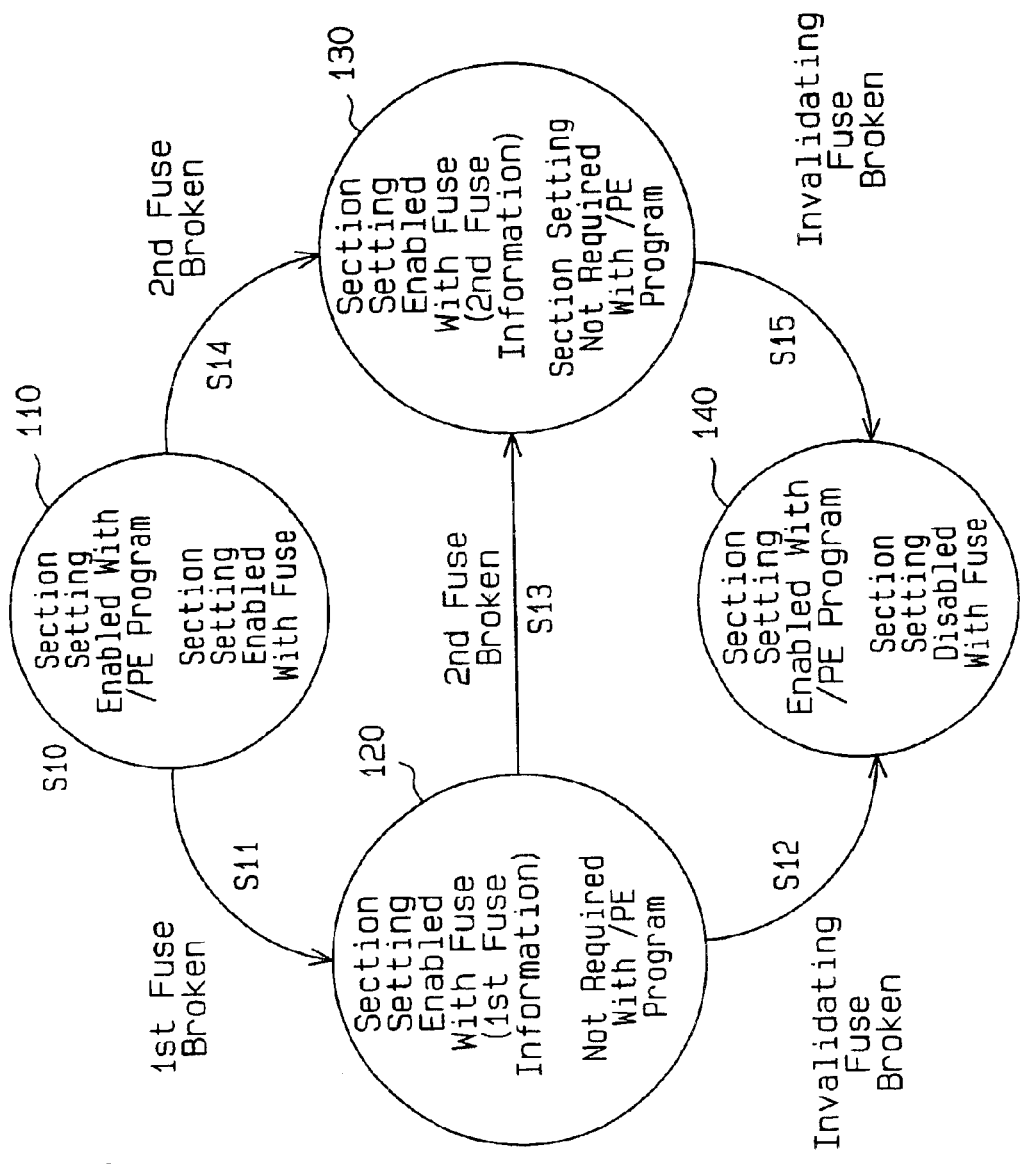
FIG. 8 is a chart illustrating states of the semiconductor device of FIG. 4.

The state and transition of the semiconductor device 10 in the first embodiment will now be discussed. With reference to FIG. 8, the semiconductor device 10 enters four states 110, 120, 130, and 140.

For example, when the determination fuses Fj of the first and second mode setting fuse circuits 12 and 13 are not broken, that is, when fuse information is not recorded in the fuse circuits 12 and 13, the semiconductor device 10 is in state 110. In state 110, the setting of the refreshing section is enabled when the program circuit 11 is provided with the program mode signal /PE and the address code Add. Further, in state 110, the setting of the refreshing section is also enabled when the fuses Fj, Fc1, Fc2, and Fc3 in the first and second mode setting fuse circuits 12 and 13 are broken.

When one of the code storage fuses Fc1 to Fc3 is broken and the determination fuse Fj is broken in the first mode setting fuse circuit 12 (S11) to store fuse information in the first mode setting fuse circuit 12, the semiconductor device 10 shifts from state 110 to state 120.

When the semiconductor device 10 is in state 120, the refreshing section is set in accordance with the code Cd1 of the first mode setting fuse circuit 12. In state 120, the setting of the refreshing section by providing the program circuit 11 with the program mode signal /PE and the address code Add is not required.

When the semiconductor device 10 is in state 110 or state 120, if one of the code storage fuses Fc1 to Fc3 is broken and the determination fuse Fj is broken in the second mode setting fuse circuit 13 to store fuse information in the second mode setting fuse circuit 13 (S13 and S14), the semiconductor device 10 shifts to state 130.

When the semiconductor device 10 is in state 130, the refresh section is set in accordance with the breakage state (code Cd2) of the code storage fuses Fc1 to Fc3 in the second mode setting fuse circuit. In state 130, the setting of the refreshing section by providing the program circuit 11 with the program mode signal /PE and the address code Add is not required.

When the semiconductor device 10 is in state 120 or state 130, if the invalidating fuse Fi is broken (S12 and S15), the semiconductor device 10 shifts to state 140. When the semiconductor device 10 is in state 140, the program circuit 11 is provided with the program mode signal /PE and the address code Add to enable the refreshing section to be set. In state 140, the setting of the refreshing section with the fuse information of the first and second mode setting fuse circuits 12 and 13 is disabled.

The first embodiment has the advantages described below.

(1) The semiconductor device 10 has two mode setting fuse circuits 12 and 13. Thus, mode setting (setting of the refreshing section) may be performed twice with the fuse information Cd1 and Cd2 of the fuse circuits 12 and 13. In other words, after setting the operation mode in accordance with the fuse information Cd1 of the first mode setting fuse circuit 12, the mode may be reset to one that is in accordance with the fuse information Cd2 by breaking the fuses Fj, Fc1, Fc2, and Fc3 of the second mode setting fuse circuit 13.

(2) The mode set by the fuse information Cd1 and Cd2 may be aborted by breaking the invalidating fuse Fi in a state in which fuse information Cd1 or Cd2 is stored. Further, the desired refreshing section may be set by inputting the program mode signal/PE and the address code Add. Therefore, when an abnormality occurs in the semiconductor device 10 that is manufactured with the fuses Fj, Fc1, Fc2, and Fc2 of the second mode setting fuse circuit 13 in a broken state, the mode corresponding to the fuse information Cd2 may be aborted by breaking the invalidating fuse Fi. This facilitates locating the cause of the abnormality.

(3) After setting the mode with the fuse information Cd1 of the first mode setting fuse circuit 12, the mode may be re-set to one corresponding to the fuse information Cd2 of the second mode setting fuse circuit 13. This reduces unnecessary inventories.

A semiconductor device 30 according to a second embodiment of the present invention will now be discussed. Elements identical to those of the first embodiment will be denoted with the same reference numerals.

Figure 9:
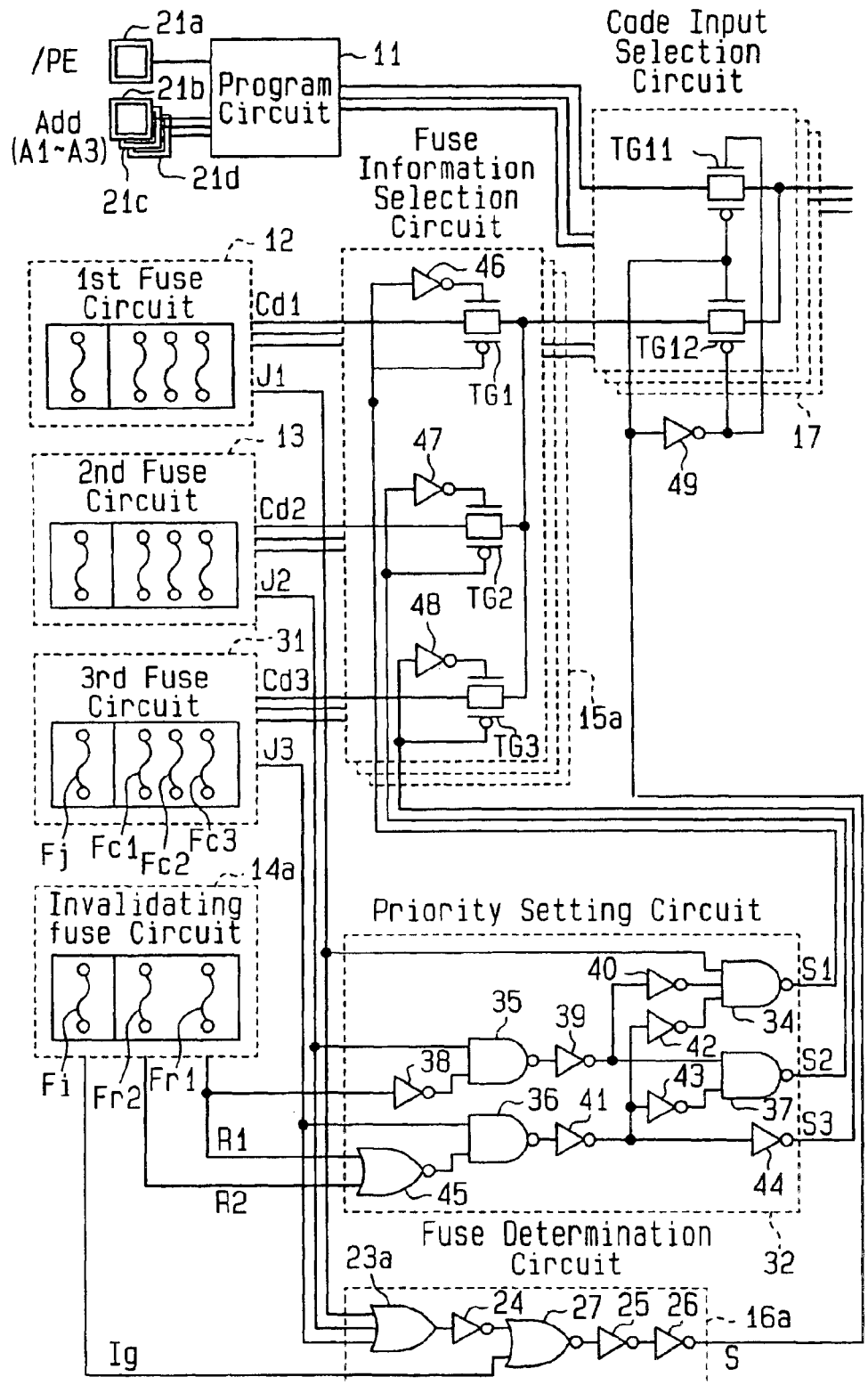
FIG. 9 is a detailed circuit diagram of a semiconductor device according to a second embodiment of the present invention.

Referring to FIG. 9, the semiconductor device (DRAM) 30 of the second embodiment includes a third mode setting fuse circuit 31 and a priority setting circuit 32. The semiconductor device 30 also includes an invalidating fuse circuit 14a, a fuse information selection circuit 15a, and a determination circuit 16a, which differ from those employed in the first embodiment. Although not shown in FIG. 9, the semiconductor device 30 includes the decoding circuit 18 and main circuit 19 of FIG. 4.

The third mode setting fuse circuit 31 includes a determination fuse Fj and code storage fuses Fc1, Fc2, and Fc3. Code Cd3, which sets the refreshing section, is stored in the third mode setting fuse circuit 31 by breaking the code storage fuses Fc1 to Fc3 of the third mode setting fuse circuit 31. The third mode setting fuse circuit 31 provides the determination circuit 16a with a determination signal J3, which is in accordance with the breakage state of the determination fuse Fj. Further, the third mode setting fuse circuit 31 provides the fuse information selection circuit 15a with the code Cd3, which is in accordance with the breakage state of the code storage fuses Fc1 to Fc3.

The invalidating fuse circuit 14a includes an invalidating fuse Fi, a first return fuse Fr1, and a second return fuse Fr2. The priority of the fuse information Cd1, Cd2, and Cd3 of the mode setting fuse circuits 12, 13, and 31 is changed in accordance with the breakage state of the first and second return fuses (altering fuses) Fr1 and Fr2. For example, the invalidating fuse circuit 14a provides the determination circuit 16 with the invalidating signal Ig, which is in accordance with the breakage state of the invalidating fuse Fi. Further, the invalidating fuse circuit 14a provides the priority setting circuit 32 with the first and second return signals R1 and R2, which are in accordance with the breakage state of the first and second return fuses R1 and R2. The return signals R1 and R2 are low when the first and second return fuses Fr1 and Fr2 are not broken and high when the first and second return fuses Fr1 and Fr2 are broken.

The priority setting circuit 32 includes NAND circuits 34, 35, 36, and 37, inverter circuits 38, 39, 40, and 41, and a NOR circuit 45. The priority setting circuit 32 generates priority signals S1, S2, and S3 in accordance with the determination signals J1 to J3 and the return signals R1 and R2. Further, the priority setting circuit 32 provides the priority signals S1 to S3 to the fuse information selection circuit 15a.

The determination signal J1 of the first mode setting fuse circuit 12 is provided to a first input terminal of the NAND circuit 34. The determination signal J2 of the second mode setting fuse circuit 13 is provided to a first input terminal of the NAND circuit 35. The determination signal J3 of the third mode setting fuse circuit 31 is provided to a first input terminal of the NAND circuit 36. The first return signal R1 of the invalidating fuse circuit 14a is provided to a second input terminal of the NAND circuit 35 via the inverter circuit 38 and to a first input terminal of the NOR circuit 45. The second return signal R2 of the invalidating fuse circuit 14a is provided to the second input terminal of the NOR circuit 45. The output signal of the NOR circuit 45 is provided to a second input terminal of the NAND circuit 36.

The output signal of the NAND circuit 35 is provided to a second input terminal of the NAND circuit 34 via the inverter circuits 39 and 40. The output signal of the NAND circuit 36 is provided to a third input terminal of the NAND circuit 34 via the inverter circuits 41 and 42. Further, the output signal of the NAND circuit 35 is provided to a first input terminal of the NAND circuit 37 via the inverter circuit 39. The output signal of the NAND circuit 36 is provided to a second input terminal of the NAND circuit 37 via the inverter circuits 41 and 43. The NAND circuit 34 outputs the priority signal S1, and the NAND circuit 37 outputs the priority signal S2. Further, the output signal of the NAND circuit 36 is generated via the inverter circuits 41 and 44 as the priority signal S3.

The fuse information selection circuit 15a includes transfer gates TG1, TG2, and TG3, which are configured by PMOS and NMOS transistors, and inverter circuits 46, 47, and 48. The input terminal of the transfer gate TG1 is connected to the first mode setting fuse circuit 12. The input terminal of the transfer gate TG2 is connected to the second mode setting fuse circuit 13. The input terminal of the transfer gate TG3 is connected to the third mode setting fuse circuit 31. Further, the output terminal of the transfer gates TG1, TG2, and TG3 are connected to the code selection circuit 17.

In the transfer gate TG1, the gate of the PMOS transistor is provided with the priority signal S1 from the priority setting circuit 32, and the gate of the NMOS transistor is provided with the priority signal S1 that is inverted by the inverter circuit 46. In the transfer gate TG2, the gate of the PMOS transistor is provided with the priority signal S2, and the gate of the NMOS transistor is provided with the priority signal S2 that is inverted by the inverter circuit 47. In the transfer gate TG3, the gate of the PMOS transistor is provided with the priority signal S3, and the gate of the NMOS transistor is provided with the priority signal S3 that is inverted by the inverter circuit 48.

The priority signals S1, S2, and S3 selectively switches on one of the transfer gates TG1, TG2, and TG3 in the fuse information selection circuit 15a. For example, when the priority signal S1 is low and the priority signals S2 and S3 are high, only the transfer gate TG1 is switched on. Thus, the fuse information Cd1 of the first mode setting fuse circuit 12 is transferred to the code selection circuit 17 via the transfer gate TG1. When the priority signal S2 is low and the priority signals S1 and S3 are high, only the transfer gate TG2 is switched on. Thus, the fuse information Cd2 of the second mode setting fuse circuit 13 is transferred to the code selection circuit 17 via the transfer gate TG2. When the priority signal S3 is low and the priority signals S1 and S2 are high, only the transfer gate TG3 is switched on. Thus, the fuse information Cd3 of the third mode setting fuse circuit 31 is transferred to the code selection circuit 17 via the transfer gate TG3.

The determination circuit 16a includes an OR circuit 23a, inverter circuits 24, 25, and 26, and a NOR circuit 27. In the first embodiment, the OR circuit 23 of the determination circuit 16 is provided with the two signals J1 and J2. However, in the second embodiment, the OR circuit 23a of the determination circuit 16a is provided with the three signals J1, J2, and J3. The determination circuit 16a generates the selection signal S in accordance with the determination signals J1, J2, and J3 and the invalidating signal Ig. Further, the determination circuit 16a provides the selection signal S to the code selection circuit 17.

The state and transition of the semiconductor device 30 will now be discussed.

Figure 10:
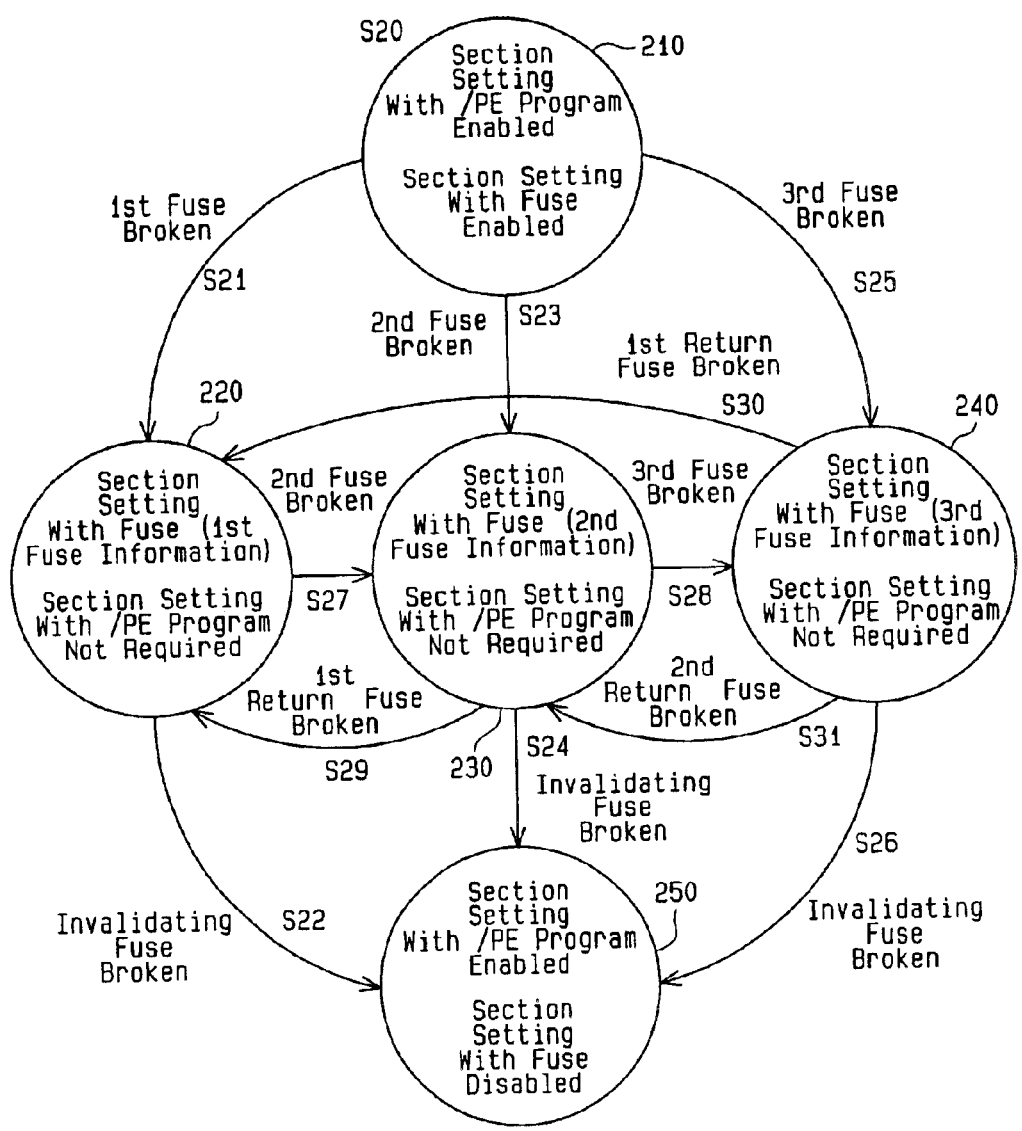
FIG. 10 is a chart illustrating states of the semiconductor device of FIG. 9.

With reference to FIG. 10, the semiconductor device 30 enters five states 210, 220, 230, 240, and 250. For example, when the determination fuses Fj and the invalidating fuses Fi of the first to third mode setting fuse circuits 12, 13, and 31 are not broken, that is, when fuse information is not recorded in the mode setting fuse circuits 12, 13, and 31, the semiconductor device 30 is in state 210. In this case, the determination signals J1 to J3, the invalidating signal Ig, and the return signals R1 and R2 are low. Further, the determination circuit 16a outputs the selection signal S at a low level to switch on the transfer gate TG11 of the code selection circuit 17 and switch off the transfer gate TG12. Accordingly, the decoding circuit 18 is connected to the program circuit 11 via the transfer gate TG11 of the code selection circuit 17. When the semiconductor device 30 is in state 210, the program mode signal/PE and the address code Add are provided to the program circuit 11 to set the refreshing section.

To store the fuse information in the first mode setting fuse circuit 12, when one of the code storage fuses Fc1 to Fc3 is broken and the determination fuse Fj is broken in the first mode setting fuse circuit 12 (S21), the semiconductor device 30 shifts from state 210 to state 220.

When the semiconductor device 30 is in state 220, the determination signal J1 is high. Further, the determination signals J2 and J3, the invalidating signal Ig, and the return signals R1 and R2 are low. The priority setting circuit 32 outputs the priority signal S1 at a low level and the priority signal S2 and S3 at a high level. The determination circuit 16a outputs the selection signal S at a high level. Thus, the transfer gate TG1 of the fuse information selection circuit 15a is switched on, and the transfer gate TG12 of the code selection circuit 17 is switched on. Accordingly, when the semiconductor device 30 is in state 220, the fuse information Cd1 of the first mode setting fuse circuit 12 is provided to the decoding circuit 18 via the fuse information selection circuit 15a and the code selection circuit 17 to set the refreshing section in accordance with the fuse information.

To store fuse information in the second mode setting fuse circuit 13 when the semiconductor device 30 is in state 210 or state 220, one of the code storage fuses Fc1 to Fc3 is broken in the second mode setting fuse circuit 13. This breaks the associated determination fuse Fj (S23 and S27) and shifts the semiconductor device 30 to state 230.

When the semiconductor device 30 is in state 230, the determination signal J2 is high. Further, the determination signal J3, the invalidating signal Ig, and the return signals R1 and R2 are low. The priority setting circuit 32 outputs the priority signal S2 at a low level and the priority signals S1 and S3 at a high level. The determination circuit 16a outputs the selection signal S at a high level. Accordingly, the transfer gate TG2 of the fuse information selection circuit 15a is switched on, and the transfer gate TG12 of the code selection circuit 17 is switched on. In this case, the fuse information Cd2 of the second mode setting fuse circuit 13 is input to the decoding circuit 18 via the fuse information selection circuit 15a and the code selection circuit 17 to set the refreshing section in accordance with the fuse information Cd2.

When the semiconductor device 30 is in any one of states 210 to 230, to store fuse information in the third mode setting fuse circuit 31, one of the code storage fuses Fc1 to Fc3 is broken in the third mode setting fuse circuit 31. This breaks the associated determination fuse Fj (S25 and S28) and shifts the semiconductor device 30 to state 240.

When the semiconductor device 30 is in state 240, the determination signal J3 is high. Further, the invalidating signal Ig and the return signals R1 and R2 are low. The priority setting circuit 32 outputs the priority signal S3 at a low level and the priority signals S1 and S2 at a high level. The determination circuit 16a outputs the selection signal S at a high level. Accordingly, the transfer gate TG3 of the fuse information selection circuit 15a is switched on, and the transfer gate TG12 of the code selection circuit 17 is switched on. In this case, the fuse information Cd3 of the third mode setting fuse circuit 31 is input to the decoding circuit 18 via the fuse information selection circuit 15a and the code selection circuit 17 to set the refreshing section in accordance with the fuse information Cd3.

When the semiconductor device 30 is in state 240, if the second return fuse Fr2 of the invalidating fuse circuit 14a is broken (S31), the semiconductor device 30 returns to state 230. In this case, the priority setting circuit 32 is provided with the second return signal R2 at a high level. Further, the priority setting circuit 32 outputs the priority signal S2 at a low level and the priority signals S1 and S3 at a high level. This switches on the transfer gate TG2 of the fuse information selection circuit 15a and sets the refreshing section in accordance with the fuse information Cd2 in the second mode setting fuse circuit 13.

When the semiconductor device 30 is in state 240 or 230, if the first return fuse Fr1 of the invalidating fuse circuit 14a is broken (S29 and S30), the semiconductor device 30 returns to state 220. In this case, the priority setting circuit 32 is provided with the first return signal R1 at a high level. Further, the priority setting circuit 32 outputs the priority signal S1 at a low level and the priority signals S2 and S3 at a high level. This switches on the transfer gate TG1 of the fuse information selection circuit 15a and sets the refreshing section in accordance with the fuse information Cd1 in the first mode setting fuse circuit 12.

When the semiconductor device 30 is in any one of states 220 to 240, if the invalidating fuse Fi is broken (S22, S24, and S26), the semiconductor device 30 shifts to state 250. When the semiconductor device 30 is in state 250, the determination circuit 16 outputs the selection signal S at a low level. This switches on the transfer gate TG11 and switches off the transfer gate TG12 in the code selection circuit 17. Thus, the decoding circuit 18 is connected to the program circuit 11 via the transfer gate TG11 of the code selection circuit 17. The setting of the refreshing section is enabled by providing the program mode signal/PE and the address code Add to the program circuit 11. In state 250, the setting of the refreshing section with the fuse information Cd1, Cd2, and Cd3 of the first to third mode setting fuse circuits 12, 13, 31 is disabled.

The second embodiment has the advantages described below.

(1) The semiconductor device 30 has three mode setting fuse circuits 12, 13, and 31. Thus, the mode (refreshing section) may be set three times with fuse information. The order of priority is set in the fuse information Cd1, Cd2, and Cd3 of the mode setting fuse circuits 12, 13, and 31. Thus, after setting the mode of the semiconductor device 30 with the fuse information Cd1 of the first mode setting fuse circuit 12, the mode is re-set to the mode that is in accordance with the fuse information Cd2 by breaking the fuses Fj, Fc1, Fc2, and Fc3 in the second mode setting fuse circuit 13. Further, the mode is re-set to the mode that is in accordance with the fuse information Cd3 by breaking the fuses Fj, Fc1, Fc2, and Fc3 in the third mode setting fuse circuit 13.

(2) The order in priority of the fuse information in each fuse circuit 12, 13, 31 is altered by breaking the first and second return fuses Fr1 and Fr2 in the invalidating fuse circuit 14. More specifically, in a state in which the mode is set in accordance with the fuse information Cd3 of the third mode setting fuse circuit 31, the mode is returned to the mode that is in accordance with the fuse information Cd2 of the second mode setting fuse circuit 13 by breaking the second return fuse Fr2. Further, in a state in which the mode is set in accordance with the fuse information Cd2 and Cd3 of the second and third mode setting fuse circuits 13 and 31, the mode is returned to the mode that is in accordance with the fuse information Cd1 of the first mode setting fuse circuit 12 by breaking the first return fuse Fr1.

(3) In a state in which the mode is set in accordance with the fuse information Cd1, Cd2, and Cd3 of any one of the first to third mode setting fuse circuits 12, 13, and 31, the mode set in accordance with the fuse information is aborted by breaking the invalidating fuse Fi. In this state, the program mode signal/PE and the address code Add are provided to set the desired refreshing section.

It should be apparent to those skilled in the art that the present invention may be embodied in many other specific forms without departing from the spirit or scope of the invention. Particularly, it should be understood that the present invention may be embodied in the following forms.

Instead of the semiconductors 10, 30 that have a memory core 19a to store data, the present invention may be applied to a semiconductor device that does not have a memory core 19a. In other words, the present invention may be applied to any semiconductor device that is set to one of a plurality of operation modes by the fuse information stored in a fuse circuit.

The number of mode setting fuse circuits is not restricted to two or three and may be four or more.

The determination fuses Fj of the fuse circuits 12, 13, and 31 may be eliminated. In this case, it is preferred that the determination signals J1, J2, and J3 be output in accordance with the breakage state of the code storage fuses Fc1 to Fc3.

When the invalidating fuse Fi is broken, instead of resetting the refreshing section with the program mode signal/PE and the address signal Add, which is input from an external device, a predetermined mode may be initialized.

The present examples and embodiments are to be considered as illustrative and not restrictive, and the invention is not to be limited to the details given herein, but may be modified within the scope and equivalence of the appended claims.

What is claimed is:

1. A semiconductor device operated in accordance with a mode selected from a plurality of modes, the semiconductor device comprising:
    a plurality of mode setting fuse circuits, each generating a setting code that designates the mode and a determination signal that indicates whether the setting code is designated;
    a fuse information selection circuit connected to the mode setting fuse circuits for selecting one of the setting codes in accordance with at least one of the determination signals; and
    an invalidating fuse circuit for generating an invalidating signal to invalidate the selected setting code.

2. The semiconductor device according to claim 1, further comprising:
    a determination circuit connected to the invalidating fuse circuit and to the mode setting fuse circuits for generating a selection signal that instructs validation or invalidation of the selected setting code in accordance with the invalidating signal.

3. The semiconductor device according to claim 2, further comprising a switching circuit connected to the determination circuit and the fuse information selection circuit, wherein the switching circuit invalidates the selected setting code when the selection signal instructs the invalidation of the setting code and validates an external setting code that is in accordance with an external mode setting signal.

4. The semiconductor device according to claim 3, wherein the mode setting signal is generated in a predetermined processing cycle by execution of a program.

5. The semiconductor device according to claim 1, wherein each of the plurality of mode setting fuse circuits includes a plurality of mode storage fuses that are broken in accordance with the setting code and a determination fuse that breaks when at least one of the mode storage fuses is broken.

6. The semiconductor device according to claim 5, wherein the number of mode storage fuses and the determination fuse is the same in each of the mode setting fuse circuits.

7. The semiconductor device according to claim 5, wherein the invalidating fuse circuit has at least one fuse, the number of all of the fuses in each mode setting fuse circuit being greater than the number of the at least one fuse in the invalidating fuse circuit.

8. The semiconductor device according to claim 1, wherein the plurality of mode setting fuse circuits include a first mode setting fuse circuit having low priority and a second mode setting fuse circuit having high priority, and wherein the fuse information selection circuit selects one of the setting codes in accordance with the determination signal of the second mode setting fuse circuit.

9. The semiconductor device according to claim 1, further comprising a memory core that is partially refreshed in a selective manner, wherein the setting code includes refreshing information of the capacity that is to be refreshed in the memory core.

10. The semiconductor device according to claim 9, wherein the refreshing information includes an address of the section of the memory core that is to be refreshed.

11. A semiconductor device operated in accordance with a mode selected from a plurality of modes, the semiconductor device comprising:
    a plurality of mode setting fuse circuits, each generating a setting code that designates the mode and a determination signal that indicates whether the setting code is designated;

a priority setting circuit connected to the mode setting fuse circuits for generating a priority signal that determines the priority order of the setting codes of the mode setting fuse circuits in accordance with the determination signals of the mode setting fuse circuits;

a fuse information selection circuit connected to the mode setting fuse circuits for selecting one of the setting codes in accordance with the priority signal; and an invalidating fuse circuit connected to the priority setting circuit for generating an invalidating signal to invalidate the selected setting code and an altering signal that changes the priority order.

12. The semiconductor device according to claim 11, further comprising:

a determination circuit connected to the invalidating fuse circuit to generate a selection signal that instructs validation or invalidation of the selected setting code in accordance with the invalidating signal.

13. The semiconductor device according to claim 12, further comprising a switching circuit connected to the determination circuit and the fuse information selection circuit, wherein the switching circuit invalidates the selected setting code when the selection signal instructs the invalidation of the setting code and validates an external setting code that is in accordance with an external mode setting signal.

14. The semiconductor device according to claim 12, wherein the mode setting signal is generated in a predetermined processing cycle by execution of a program.

15. The semiconductor device according to claim 11, wherein each of the plurality of mode setting fuse circuits includes a plurality of mode storage fuses that are broken in accordance with the setting code and a determination fuse that breaks when at least one of the mode storage fuses is broken.

16. The semiconductor device according to claim 15, wherein the number of mode storage fuses and the determination fuse is the same in each of the mode setting fuse circuits.

17. The semiconductor device according to claim 15, wherein the invalidating fuse circuit has at least one fuse, the number of all of the fuses in each mode setting fuse circuit being greater than the number of the at least one fuse in the invalidating fuse circuit.

18. The semiconductor device according to claim 11, wherein the invalidating fuse circuit includes an invalidating fuse and generates the invalidation signal in accordance with the breakage state of the invalidating fuse.

19. The semiconductor device according to claim 18, wherein the invalidating fuse circuit includes an altering fuse, generates the altering signal in accordance with the breakage state of the altering fuse, and provides the altering signal to the priority setting circuit.

20. The semiconductor device according to claim 11, further comprising a memory core that is partially refreshed in a selective manner, wherein the setting code includes refreshing information of the capacity that is to be refreshed in the memory core.

21. The semiconductor device according to claim 20, wherein the refreshing information includes an address of the section of the memory core that is to be refreshed.

22. A method for controlling a semiconductor device operated in a mode that is in accordance with a setting code, the method comprising:

setting a first setting code with a first mode setting fuse circuit;

setting a second setting code with a second mode setting fuse circuit; and selecting one of the first and second setting codes.

23. The method according to claim 22, further comprising:

selecting an external setting code that is in accordance with an external mode setting signal when the first and second setting codes are not set.

24. The method according to claim 22, further comprising:

invalidating the first and second setting codes and validating an external setting code that is in accordance with an external mode setting signal using an invalidating fuse circuit.

25. A method for controlling a semiconductor device operated in a mode that is in accordance with a setting code, the method comprising:

setting a first setting code with at least one of a plurality of mode setting fuse circuits;

setting a second setting code in accordance with an external mode setting signal; and validating one of the first and second setting codes.

26. A method for controlling a semiconductor device operated in a mode that is in accordance with a setting code, the method comprising:

setting a first setting code with a first mode setting fuse circuit;

setting a second setting code with a second mode setting fuse circuit;

selecting one of the first and second setting codes in accordance with a predetermined priority order; and validating one of the selected setting code and an external setting code that is in accordance with an external mode setting signal.

27. The method according to claim 26, wherein said validating includes validating the external setting code when a fuse of the first mode setting fuse circuit and a fuse of the second mode setting fuse circuit are not broken.

28. The method according to claim 26, wherein said validating includes validating the first setting code when a fuse of the first mode setting fuse circuit is broken and a fuse of the second mode setting fuse circuit is not broken.

29. The method according to claim 26, wherein said validating includes validating the second setting code when a fuse of the first mode setting fuse circuit is broken and a fuse of the second mode setting fuse circuit is broken.

30. The method according to claim 26, wherein said validating includes validating the external setting code by breaking an invalidating fuse when a fuse of the first mode setting fuse circuit is broken and a fuse of the second mode setting fuse circuit is broken.

31. The method according to claim 30, wherein said validating includes validating the first setting code by breaking an altering fuse when the fuse of the first mode setting fuse circuit is broken and the fuse of the second mode setting fuse circuit is broken.

32. A method for controlling a semiconductor device including a plurality of mode setting fuse circuits and an invalidating fuse, wherein the semiconductor device enters one of a first state in which fuses of the mode setting fuse circuits are not broken, a second state in which the fuse of at least one of the mode setting fuse circuits is broken, and a third state in which the fuse of at least one of the mode setting fuse circuits is broken and the invalidating fuse is broken, the method comprising:

designating a mode of the semiconductor device in accordance with an external mode setting signal when the semiconductor device is in the first state;

designating a mode that is in accordance with a setting code set by at least one of the mode setting fuse circuits when the semiconductor device is in the second state; and designating the mode in accordance with the external mode setting signal when the semiconductor device is in the third state.

33. A method for controlling a semiconductor device including a first mode setting fuse circuit, a second mode setting fuse circuit, an invalidating fuse, and an altering fuse, wherein the semiconductor device enters one of a first state in which fuses of the first and second mode setting fuse circuits are not broken, a second state in which the fuse of the first mode setting fuse circuit is broken and a fuse of the second mode setting fuse circuit is not broken, a third state in which the fuse of the second mode setting fuse circuit is broken and the fuse of the first mode setting fuse circuit is not broken, a fourth state in which the fuse of at least one of the first and second mode setting fuse circuits is broken and the invalidating fuse is broken, and a fifth state in which the altering fuse is broken, the method comprising:

designating a mode of the semiconductor device in accordance with an external mode setting signal when the semiconductor device is in the first state;

designating a mode that is in accordance with a setting code set by the first mode setting fuse circuit when the semiconductor device is in the second state;

designating a mode that is in accordance with a setting code set by the second mode setting fuse circuit when the semiconductor device is in the third state; and designating the mode that is in accordance with the setting code set by the first mode setting fuse circuit when the semiconductor device is in the fifth state.

34. A method for controlling a semiconductor device operated in a mode that is in accordance with a setting code selected from a plurality of setting codes including setting codes stored in a plurality of mode setting fuse circuits, which includes a first mode setting fuse circuit and a second mode setting fuse circuit, and a setting code corresponding to an external mode setting signal, the method comprising:

selecting one of the following for validation:
the setting code corresponding to the external mode setting signal, which is validated by maintaining the mode setting fuse circuits in a state in which fuses of the mode setting fuse circuits are not broken;
the setting of a mode that is in accordance with the setting code of the first mode setting fuse circuit, which is validated by breaking the fuse of the first mode setting fuse circuit;
the setting of a mode that is in accordance with the setting code of the second mode setting fuse circuit, which is validated by breaking the fuse of the second mode setting fuse circuit; and
the setting of a mode that is in accordance with the external mode setting signal, which is validated by breaking the invalidating fuse; and performing validation in accordance with the selection in the step of selecting.

35. The method according to claim 34, wherein the plurality of mode setting fuse circuits each include a determination fuse that is broken when the setting code is set for the mode setting fuse circuit, wherein the step of selecting includes a selection for validation of:

the setting code of one of the mode setting fuse circuits in accordance with a predetermined priority order when at least two of the determination fuses are broken.

36. The method according to claim 35, wherein the semiconductor device includes an altering fuse, and the priority order is altered when the altering fuse is broken.

37. A method for controlling a semiconductor device operated in a mode that is in accordance with a setting code selected from a plurality of setting codes including setting codes stored in a plurality of mode setting fuse circuits, which includes a first mode setting fuse circuit, a second mode setting fuse circuit, and a third mode setting fuse circuit, and a setting code corresponding to an external mode setting signal, the method comprising:

selecting one of the following settings for validation:
the setting code corresponding to the external mode setting signal, which is validated by maintaining the mode setting fuse circuits in a state in which fuses of the mode setting fuse circuits are not broken;
the setting of a mode that is in accordance with the setting code of the first mode setting fuse circuit, which is validated by breaking the fuse of the first mode setting fuse circuit;
the setting of a mode that is in accordance with the setting code of the second mode setting fuse circuit, which is validated by breaking the fuse of the second mode setting fuse circuit;
the setting of a mode that is in accordance with the setting code of the third mode setting fuse circuit, which is validated by breaking the fuse of the third mode setting fuse circuit;
the setting code of an invalidated mode setting fuse circuit in lieu of the setting code of a validated mode setting fuse circuit, which is validated by breaking an altering fuse; and
the setting of a mode that is in accordance with the external mode setting signal, which is validated by breaking the invalidating fuse and invalidating the setting of the modes that are in accordance with the first, second, and third mode setting fuse circuits; and performing validation in accordance with the selection in the step of selecting.

38. The method according to claim 37, wherein the plurality of mode setting fuse circuits each include a mode storage fuse, which stores the setting code in accordance with the breakage state of the associated fuse, and a determination fuse, which determines whether the mode storage fuse is broken, and the step of selecting includes a selection for validation of:

determining a priority order of the setting codes of the mode setting fuse circuits that are to be validated in accordance with a breakage state of the determination fuses when the mode storage fuses of at least two of the mode setting fuse circuits are broken.

39. The method according to claim 37, wherein said selection of the setting code of an invalidated mode setting fuse circuit includes altering the priority order when the altering fuse is broken.

* * * * *